United States Patent
Wang et al.

(10) Patent No.: US 6,660,638 B1
(45) Date of Patent: Dec. 9, 2003

(54) CMP PROCESS LEAVING NO RESIDUAL OXIDE LAYER OR SLURRY PARTICLES

(75) Inventors: Ying-Lang Wang, Tai-Chung (TW); Shih-Chi Lin, Taipei (TW); Yi-Lung Cheng, Taipei (TW); Chi-Wen Liu, Hsinchu (TW); Ming-Hua Yoo, Ilam (TW); Wen-Kung Cheng, Touten (TW); Jiann-Kwang Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 130 days.

(21) Appl. No.: 10/038,389

(22) Filed: Jan. 3, 2002

(51) Int. Cl.7 ............................................. H01L 21/461
(52) U.S. Cl. ........................ 438/692; 438/693; 438/633
(58) Field of Search ................. 438/626, 631, 438/633, 648, 656, 685, 675, 692, 693

(56) References Cited

U.S. PATENT DOCUMENTS

| | | | |
|---|---|---|---|
| 5,662,769 A | | 9/1997 | Schonauer et al. ......... 438/633 |
| 5,704,987 A | * | 1/1998 | Huynh et al. ................ 136/6 |
| 5,868,863 A | | 2/1999 | Hymes et al. ................ 134/28 |
| 5,968,280 A | | 10/1999 | Ronay ........................... 134/2 |
| 6,083,419 A | * | 7/2000 | Grumbine et al. ............ 216/88 |
| 6,165,956 A | | 12/2000 | Zhang et al. ............... 510/175 |
| 6,207,630 B1 | | 3/2001 | Vaartstra ..................... 510/175 |

OTHER PUBLICATIONS

S. Wolf and R.N. Tauber, "Silicon Processing for the VLSI Era vol. 1—Process Technology," 2000 by Lattice Press, Second Edition, pp. 741–747 & 761–764.*

* cited by examiner

Primary Examiner—Tuan H. Nguyen
(74) Attorney, Agent, or Firm—George O. Saile; Stephen B. Ackerman

(57) ABSTRACT

Two problems seen in CMP as currently executed are a tendency for slurry particles to remain on the surface and the formation of a final layer of oxide. These problems have been solved by adding to the slurry a quantity of TMAH or TBAH. This has the effect of rendering the surface being polished hydrophobic. In that state a residual layer of oxide will not be left on the surface at the conclusion of CMP. Nor will many slurry abrasive particles remain cling to the freshly polished surface. Those that do are readily removed by a simple rinse or buffing. As an alternative, the CMP process may be performed in three stages—first convention CMP, then polishing in a solution of TMAH or TBAH, and finally a gentle rinse or buffing.

3 Claims, 3 Drawing Sheets

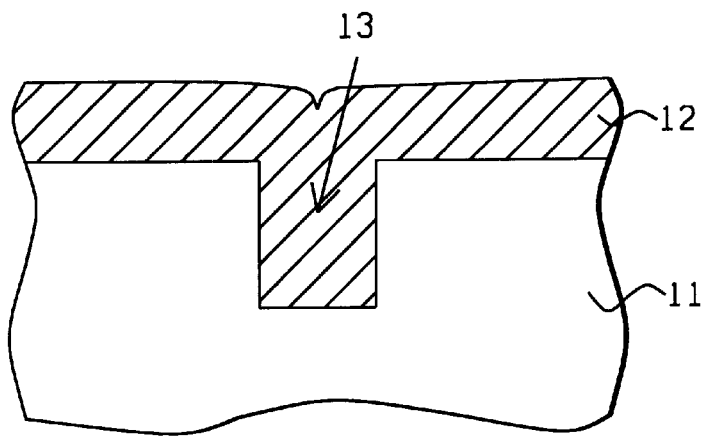
FIG. 1 – Prior Art
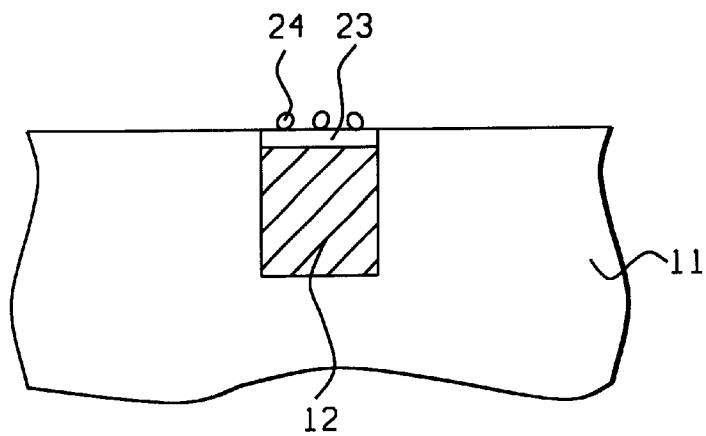
FIG. 2 – Prior Art
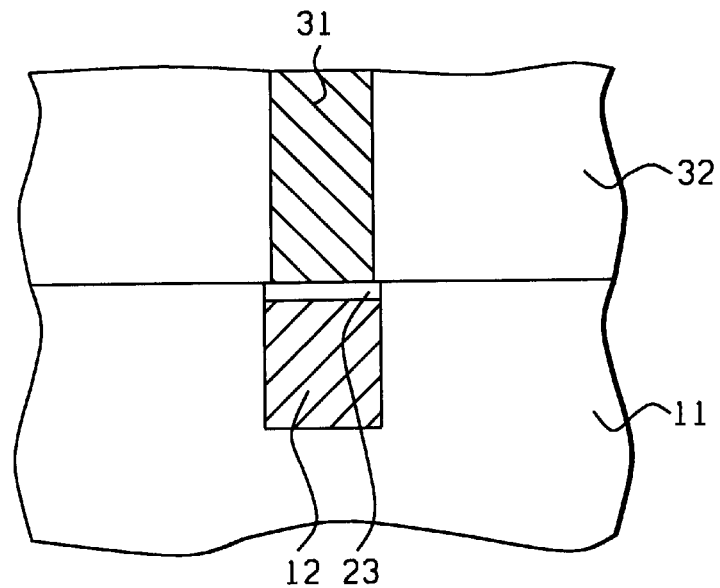
FIG. 3 – Prior Art

CM P PROCESS LEAVING NO RESIDUAL OXIDE LAYER OR SLURRY PARTICLES

FIELD OF THE INVENTION

The invention relates to the general field of chem-mech polishing with particular reference to controlling the state of the final surface.

BACKGROUND OF THE INVENTION

Chemical mechanical polishing (CMP) is now widely used in the semiconductor manufacturing industry as the method of choice for planarizing any given layer prior to the deposition of the next layer. As an example, consider a dielectric layer 11, as shown schematically in FIG. 1, in which a cavity 13 has been formed and then over-filled with a layer of a metal 12, such as tungsten or copper.

To perform CMP a slurry of abrasive particles (typically $SiO_2$ or $Al_2O_3$ particles) having a mean diameter between about 1 and 10,000 microns) suspended in an aqueous solution of hydrogen peroxide and nitric acid, is used. The hydrogen peroxide oxidizes the surface that is being polished thereby forming a brittle layer of oxide that is readily dislodged by the suspended particles.

Although the CMP process as described above works well in many respects, a few problems still remain. Two such problems are illustrated in FIG. 2. The first is exemplified by slurry particles 24, some of which tend to remain on the surface of the metal at the conclusion of CMP. These have to be removed in a separate operation and can often remain in place when not expected to. The second problem is exemplified in layer 23 which represents a final layer of oxide that remains at the conclusion of CMP. When processing continues, layer 23 may remain in place and increase the contact resistance to the next metal layer, as shown in FIG. 3 where oxide layer 23 has become interposed between the two metal plugs 12 and 31, the latter being contained within a second dielectric layer 32.

There is therefore a need for a CMP process wherein no oxide layer remains on the surface of a metal after CMP and wherein no particles of abrasive material remain either. Preferably such a process would be part of the standard CMP process as currently used so as to introduce minimum disruption into the overall manufacturing process.

A routine search of the prior art was performed with the following references of interest being found:

In U.S. Pat. No. 5,662,769, Schonauer et al. show a tungsten CMP process and post clean. In U.S. Pat. No. 6,165,956, Zhang et al. show a tungsten CMP together with $NH_4OH$ brushing in the background section. U.S. Pat. No. 5,968,280 (Ronay) shows a poly-electrolyte post CMP clean. While U.S. Pat. No. 5,868,863 (Hymer et al.) and U.S. Pat. No. 6,207,630 (Vaarstra) are related processes.

SUMMARY OF THE INVENTION

It has been an object of at least one embodiment of the present invention to provide an improved process for CMP.

Another object of at least one embodiment of the present invention has been that, at the conclusion of said process there be no oxide layer present on the surface of a metal that has been subjected to said process.

Still another object of at least one embodiment of the present invention has been that, at the conclusion of said process there be no particles of slurry abrasive present on the surface of a metal that has been subjected to said process.

A further object of at least one embodiment of the present invention has been that said process be suitable for use with tungsten and copper.

Yet another object of at least one embodiment of the present invention has been to provide a process to easily render hydrophobic a surface that is normally hydrophilic.

These objects have been achieved by adding to the slurry a quantity of TMAH or TBAH. This has the effect of rendering the surface being polished hydrophobic. In that state a residual layer of oxide will not be left on the surface at the conclusion of CMP. Nor will many slurry abrasive particles remain cling to the freshly polished surface. Those that do are readily removed by a simple rinse or buffing. As an alternative, the CMP process may be performed in three stages—first convention CMP, then polishing in a solution of TMAH or TBAH, and finally a gentle rinse or buffing.

BRIEF DESCRIPTION OF THE DRAWINGS

FIG. 1 is a cross-section showing a cavity over-filled with metal prior to CMP.

FIG. 2 shows the structure of FIG. 1 at the conclusion of CMP as practiced in the prior art.

FIG. 3 shows how the surface seen in FIG. 2 can lead to contact resistance between layers.

DESCRIPTION OF THE PREFERRED EMBODIMENTS

Figure 4:
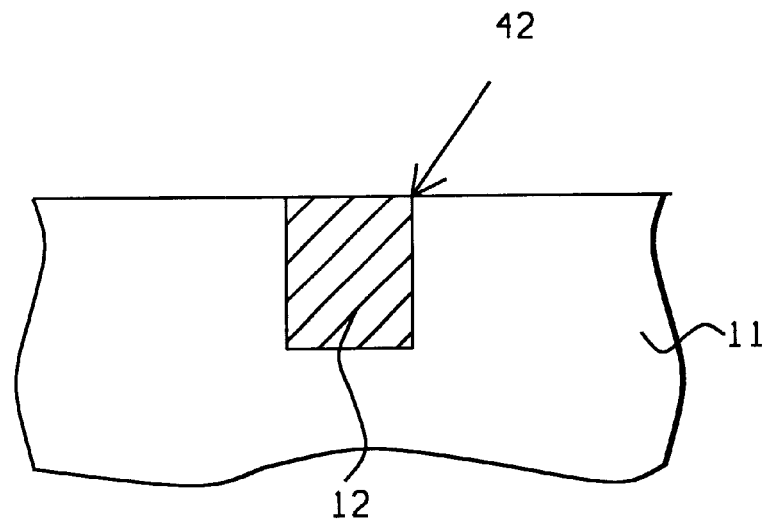
FIG. 4 illustrates a surface after CMP according to the teachings of the present invention.
Figure 5:
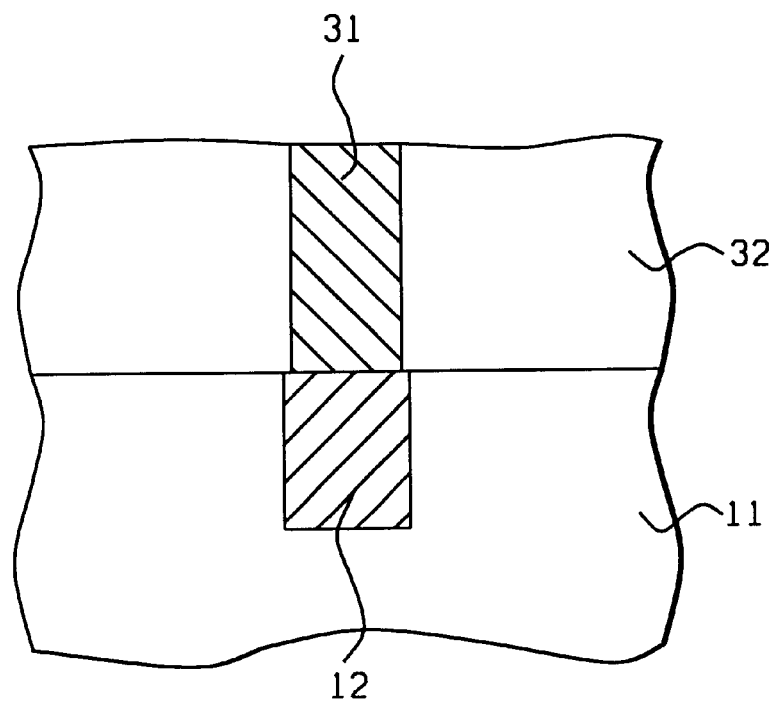
FIG. 5 shows how contact resistance between layers is eliminated when the structure of FIG. 5 is used.

The key feature of the present invention is the addition to the slurry of a suitable agent to render the surface that is being polished hydrophobic instead of its normal hydrophilic state. We have discovered two such suitable additives. These are Tetra-methyl-ammonium-hydroxide (TMAH) and Tetra-butyl-ammonium-hydroxide (TBAH). If either (or both) of these agents is added to the slurry, the surface of the tungsten plug after CMP is as shown in FIG. 4 where surface 42 is seen to be free of both an oxide layer and any clinging residual particles of slurry abrasive. Accordingly, when the next level of metalization 31 is deposited to connect to plug 12 no contact resistance layer is present (see FIG. 5). Typically, the concentration of TMAH in the slurry suspension has been between about 2% and 20% with 5% being preferred, while for TBAH the concentration in the slurry has been between about 2 and 20% with about 10% being preferred.

Figure 6:
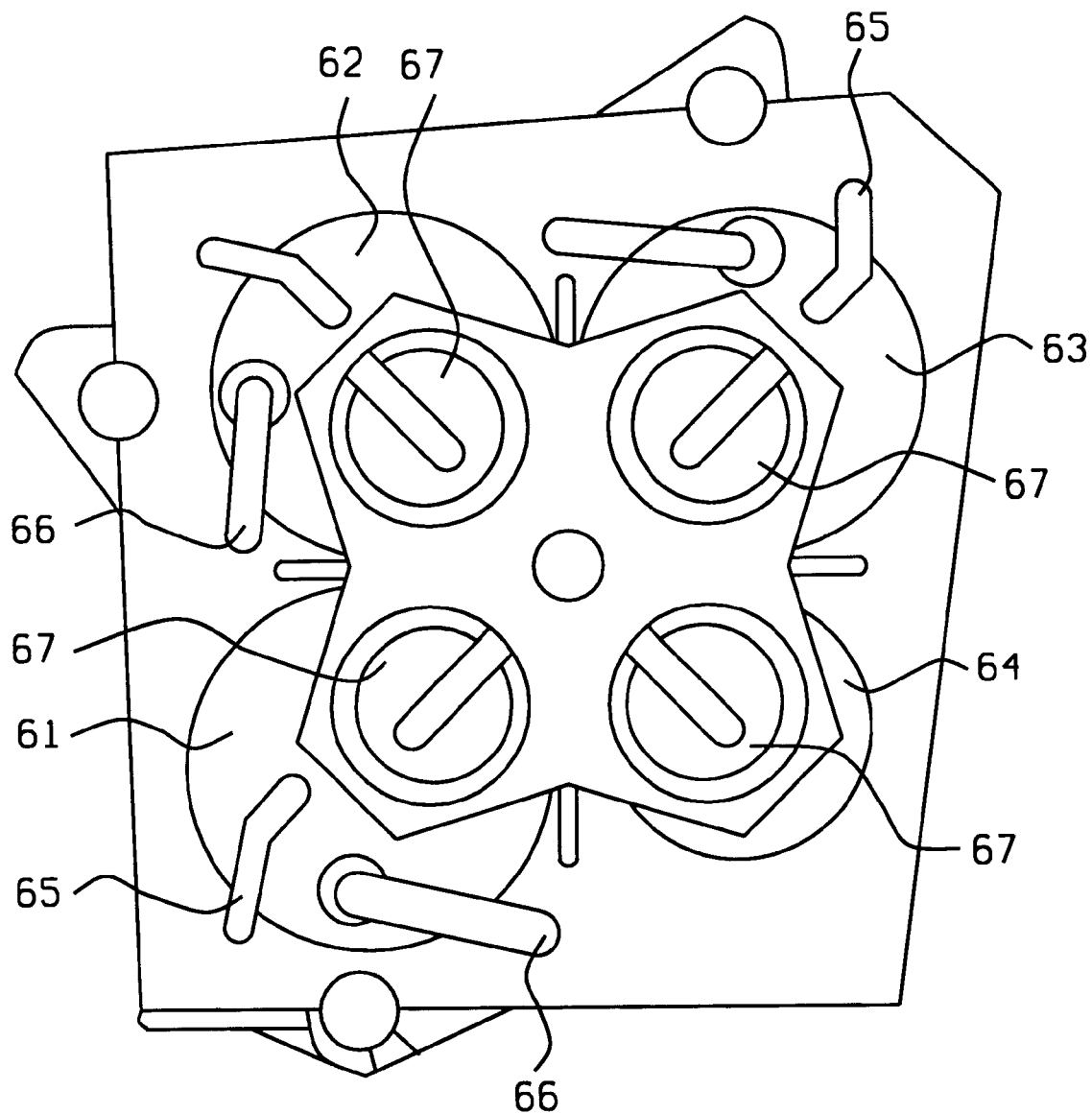
FIG. 6 illustrates how the process of the present invention may be implemented as three separate sequential operations.

An alternative to adding the TMAH or TBAH directly to the slurry is to perform the CMP operation in three stages. This is illustrated in FIG. 6 which shows three CMP stations and a loading/unloading station 64.

After the wafer has been loaded into holder 67 it is moved to station 61(that includes a platen and polishing pad that are not explicitly shown) where conventional CMP takes place until the requisite amount of material has been removed. Slurry is dispensed onto the pad surface from dispenser 65 while attachment 66 serves to periodically recondition the pad surface by means of a combing action. Polishing of layer 12 (see FIG. 1) is achieved using a slurry that comprises a suspension of abrasive particles in deionized water, and hydrogen peroxide.

Once there is no longer any metal on the dielectric surface outside cavity 13, the wafer holder is moved to station 62 where the freshly created metal surface is polished with an aqueous solution of TMAH (concentration between about 2% and 20%, with about 5% being preferred), or TBAH (concentration between about 2% and 20%, with about 10% being preferred). This has the effect of removing any oxide layer from the metal surface. Additionally, this surface is also rendered hydrophobic so that few slurry particles remain on it and those that do are only very loosely attached.

Next, the wafer is transferred to station 63 where it is gently buffed using deionized water, so that any remaining abrasive particles get removed. Finally, the wafer moves on to station 64 where it is removed and a fresh wafer is loaded in its place.

What is claimed is:

1. A process for performing CMP, comprising:

providing a dielectric layer having a first surface;

forming a cavity in said dielectric layer;

onto said first surface depositing a layer of tungsten, whereby said cavity becomes overfilled with tungsten;

polishing said tungsten layer with a slurry that comprises a suspension of abrasive particles in deionized water, hydrogen peroxide, and an agent that causes a surface to be hydrophobic until said cavity is just filled with tungsten, having a second surface, and there is no tungsten on said first surface; and rinsing said tungsten layer in deionized water whereby there is no oxide layer on said second surface and all of said abrasive particles have been removed.

2. The process described in claim 1 wherein said agent that causes a surface to be hydrophobic is TMAH having a concentration in said slurry of between about 2% and 20%.

3. The process described in claim 1 wherein said agent that causes a surface to be hydrophobic is TBAH having a concentration in said slurry of between about 2% and 20%.

* * * * *

UNITED STATES PATENT AND TRADEMARK OFFICE
CERTIFICATE OF CORRECTION

PATENT NO.     : 6,660,638 B1                                              Page 1 of 1
DATED          : December 9, 2003
INVENTOR(S)    : Ying-Lang Wang et al.

It is certified that error appears in the above-identified patent and that said Letters Patent is hereby corrected as shown below:

<u>Title page</u>,
Item [75], delete "Ming-Hua Yoo, Ilam (TW)", and replace it with -- Ming-Hua Yoo, Ilan (TW) --, and delete "Wen-Kung Cheng, Touten (TW)", and replace it with -- Wen-Kung Cheng, Toufen (TW) --.

Signed and Sealed this

Twentieth Day of January, 2004

JON W. DUDAS
*Acting Director of the United States Patent and Trademark Office*